United States Patent
Pachler

(10) Patent No.: US 9,203,001 B2
(45) Date of Patent: Dec. 1, 2015

(54) LED MODULE FOR MODIFIED LAMPS AND MODIFIED LED LAMP

(75) Inventor: Peter Pachler, Graz (AT)

(73) Assignee: Tridonic Jennersdorf GmbH, Jennersdorf (AT)

( * ) Notice: Subject to any disclaimer, the term of this patent is extended or adjusted under 35 U.S.C. 154(b) by 48 days.

(21) Appl. No.: 13/255,694

(22) PCT Filed: Feb. 26, 2010

(86) PCT No.: PCT/EP2010/052459
§ 371 (c)(1),
(2), (4) Date: Nov. 18, 2011

(87) PCT Pub. No.: WO2010/102911
PCT Pub. Date: Sep. 16, 2010

(65) Prior Publication Data
US 2012/0068204 A1    Mar. 22, 2012

(30) Foreign Application Priority Data

Mar. 9, 2009  (EP) ...................................... 09154642
Apr. 9, 2009  (DE) ..................... 20 2009 005 453 U

(51) Int. Cl.
*H01L 33/46*    (2010.01)
*H01L 33/60*    (2010.01)
*F21Y 101/02*   (2006.01)
*F21K 99/00*    (2010.01)

(52) U.S. Cl.
CPC . *H01L 33/60* (2013.01); *F21K 9/13* (2013.01); *F21Y 2101/02* (2013.01); *H01L 2924/0002* (2013.01)

(58) Field of Classification Search
CPC ..................... H01L 33/60; H01L 2924/00014; H01L 2224/8592; F21Y 2101/02; F02K 9/13

USPC ................ 257/89, 88, 98; 362/235, 249, 231; 313/512, 110, 506, 112, 498
See application file for complete search history.

(56) References Cited

U.S. PATENT DOCUMENTS

| | | | |
|---|---|---|---|
| 2004/0239242 A1 | 12/2004 | Mano et al. | |
| 2006/0012991 A1 | 1/2006 | Weaver, Jr. et al. | |
| 2006/0138441 A1* | 6/2006 | Kromotis | H01L 25/0753 257/99 |
| 2007/0018175 A1 | 1/2007 | Mazzochette et al. | |
| 2008/0173883 A1* | 7/2008 | Hussell | G02B 6/0073 257/98 |
| 2008/0290351 A1* | 11/2008 | Ajiki | H01L 25/0753 257/88 |

(Continued)

FOREIGN PATENT DOCUMENTS

| | | |
|---|---|---|
| DE | 102005062514 A1 | 3/2007 |
| EP | 1160883 A2 | 5/2001 |
| WO | WO 2009033642 A1 | 3/2009 |

OTHER PUBLICATIONS

International Search Report PCT/EP/2010/052459, dated Mar. 30, 2011, 6 pages.

(Continued)

*Primary Examiner* — Kenneth Parker
*Assistant Examiner* — Bo Fan
(74) *Attorney, Agent, or Firm* — Lee & Hayes, PLLC

(57) ABSTRACT

An LED module includes a printed circuit board (PCB) or a surface mount device (SMD) mount, an LED chip mounted on the PCB or the SMD mount, a cover mounted on the LED chip and a surface of the PCB or the SMD mount which surrounds the LED chip. The surface of the PCB or the SMD mount on which the spherical cover is mounted may be covered on its side walls with a white reflective material which is in contact with the LED chip.

16 Claims, 5 Drawing Sheets

(56) References Cited

U.S. PATENT DOCUMENTS

| | | |
|---|---|---|
| 2009/0050907 A1 | 2/2009 | Yuan et al. |
| 2009/0236619 A1* | 9/2009 | Chakroborty .................. 257/89 |
| 2009/0267093 A1* | 10/2009 | Kamada et al. ................. 257/98 |
| 2010/0237766 A1* | 9/2010 | Baumgartner .......... F21K 9/135 313/498 |
| 2012/0061709 A1 | 3/2012 | Pachler |

OTHER PUBLICATIONS

International Search Report PCT/EP2010/052453, dated Sep. 15, 2010, 5 pages.

Office Action for U.S. Appl. No. 13/255,856, mailed on Oct. 25, 2013, Peter Pachler, "LED Module With Improved Light Output", 13 pages.

Final Office Action for U.S. Appl. No. 13/255,856, mailed on May 12, 2014, Peter Pachler, "LED Module With Improved Light Output", 12 pages.

Office Action for U.S. Appl. No. 13/255,856, mailed on Mar. 12, 2015, Peter Pachler, "LED Module With Improved Light Output," 16 pages.

* cited by examiner

Stand der Technik

Stand der Technik

LED MODULE FOR MODIFIED LAMPS AND MODIFIED LED LAMP

This Application is a National Stage of International Application No. PCT/EP2010/052459, filed Feb. 26, 2010, which claims foreign priority to EP Application No. 09154642.4, filed Mar. 9, 2009, and DE Application No. 20 2009 005 453.5, filed Apr. 9, 2009, all of which are incorporated herein by reference.

The light output for "packaged LEDs" using COB (Chip-On-Board) technology is influenced by the optical characteristics of the surrounding package materials, in particular by the reflection and the position of the phosphor and of the LED chip. It is important that the packed in materials have a) high reflectivity
b) high light stability
c) high thermal stability.

Figure 1:
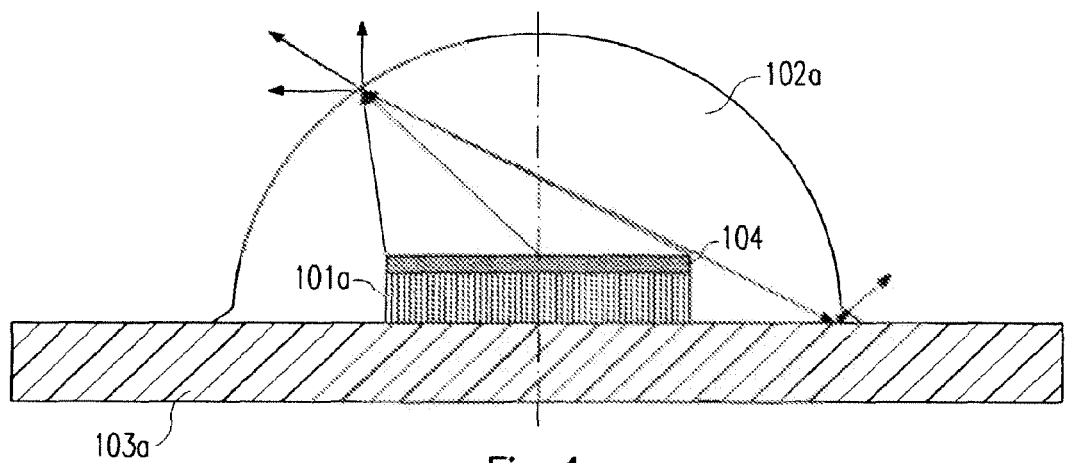

The typical light paths of emitted radiation from a phosphor-converted LED which emits white light and has a coated phosphor on the emitting surface of the LED chip is shown in FIG. 1. One configuration of an LED is to place the emitter in the center of a hemisphere, in order that the light can emerge from the LED package with minimal reflection loss. A small percentage of the light is reflected back to the chip and to the surrounding area of the PCB or SMD package, where it is either absorbed or reflected. If the hemispherical spherical cover is large enough, about 3% to 5% of the light is reflected and can be lost, depending on the refractive index of the hemispherical material. Since the phosphor emits light in all directions, approximately half of the light must be reflected by the LED itself, in which process some further losses occur. Although a high reflection capability is likewise a characteristic which the LED chip should itself have, its main function is to emit efficient light, which could mean a reduction in its reflection capability.

If high light densities are not required, the phosphor can likewise be distributed in the hemispherical spherical cover. This obviously does not result in any advantage in terms of light output and the beam path, but the color stability and the color reproduction can be controlled more easily, and the light densities are not too high, which means that less effort needs to be expended in terms of freedom from glare.

Since a very much larger proportion of the emitted light falls into the PCB or SMD package, the reflection capability of the PCB or SMD package has a major influence on the final light output. Since, in some cases, surfaces must be bonded with gold wire in order to connect the chip, distances must be maintained in accordance with pattern rules, in order to keep surfaces free of solder resist masks, as a result of which the overall reflection capability of the PCB board or of the SMD package may be restricted, or it is possible to use only materials which are less stable.

The object of the present invention is to improve the light output of an LED module having a spherical cover.

This object is achieved by the features of the independent patent claims. The dependent claims develop the central concept of the present invention further.

An LED lamp which has been converted as an incandescent bulb has an LED module which has a printed circuit board or an SMD mount and a multiplicity of LED chips which are mounted on the board or the mount, wherein a spherical cover is arranged, that is to say distributed or mounted on the LED chips and on that surface of the board or of the mount which surrounds the LED chip. At least one LED chip emits blue light which is partially converted by a phosphor, and wherein at least one LED chip emits a spectrum, preferably in the red spectrum, which is not significantly adversely affected by the phosphor.

An LED module has a printed circuit board or an SMD mount and at least one LED chip, which is mounted on the board or the mount. A spherical cover is arranged on the LED chip, that is to say is distributed or mounted on the LED chip and that surface of the board or of the mount which surrounds the LED chip. The surface of the board or of the mount on which the spherical cover is distributed or arranged is covered preferably on its side walls with a white reflective material which is in contact with the LED chip.

The reflective material may be a layer which has a thickness of between 5 µm and 250 µm, preferably 20 µm to 200 µm, more preferably 100 µm to 150 µm.

The reflective material may be in the form of a layer, wherein the upper surface is lower than the upper surface of the LED chip when the LED module is viewed from the side with the LED chip on the board or the mount.

The reflective material may be a layer whose thickness is between 75% and 90% of the thickness of the LED chip.

A lateral side wall of the LED chip may likewise be coated with a material which is designed such that it is reflective for light which strikes the LED chip ("white coating").

A color conversion material may be provided at the top in the spherical cover and/or on the upper surface of the LED chip.

The reflective material may be reflective at least for the spectrum which is emitted from the LED chip and the color conversion material, if present ("white" coating therefore means reflective for at least the visible part of the spectrum which is emitted from the LED chip and each converted spectrum).

The LED module may emit essentially white light, which is a mixture from the spectrum of the LED chip and the emission spectrum of the color conversion material.

The reflective material may be an electrically insulating material.

A multiplicity of LED chips may be arranged under the same spherical cover.

At least one LED chip may emit a spectrum such as blue light, which is partially converted down by a phosphor, and at least one further LED chip emits a spectrum, such as red light, which is essentially unaffected by the phosphor.

The invention likewise relates to a converted LED lamp which has at least one LED module as explained above.

Further advantages, features and purpose of the present invention will now become obvious to a person skilled in the art on reading the following detailed description of one embodiment of the invention, when this is considered in conjunction with the figures in the enclosed drawings.

Figure 2:
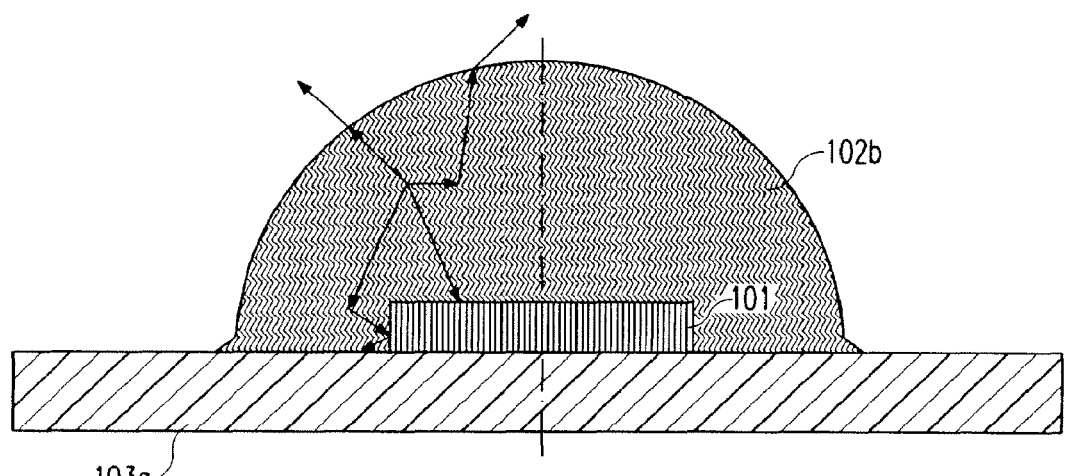

FIG. 1 shows a chip package with a phosphor layer which represents the prior art, FIG. 2 shows a chip package with distributed phosphor which represents the prior art.

Figure 3:
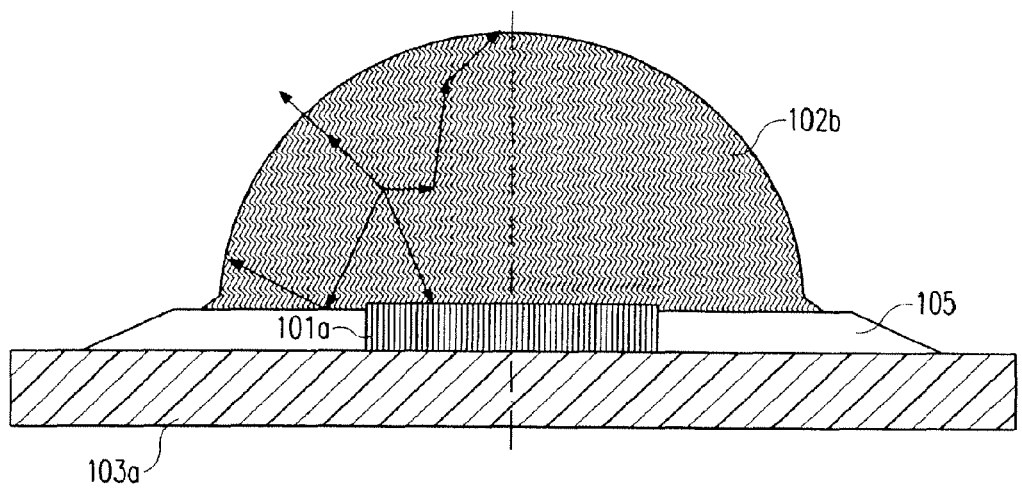
Figure 4:
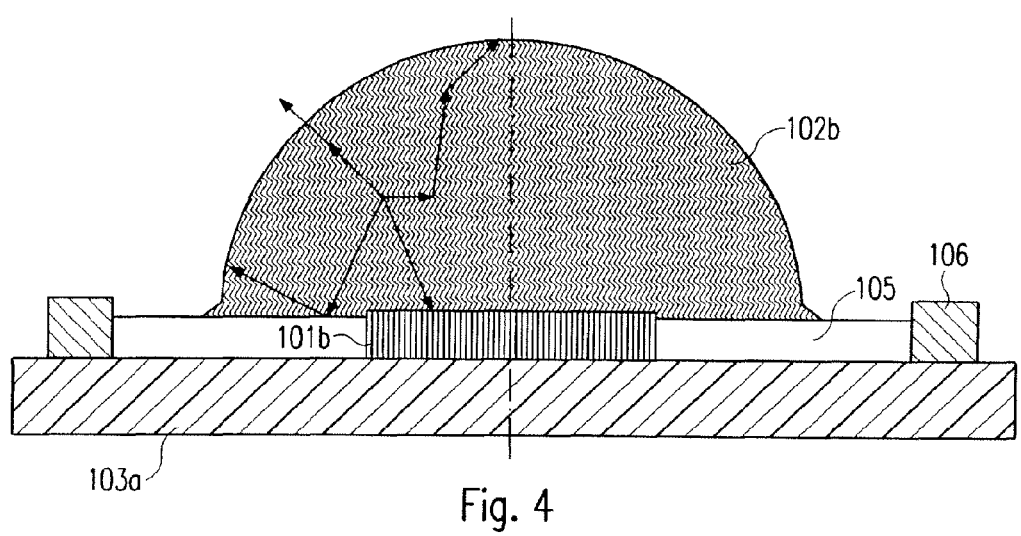
Figure 5:
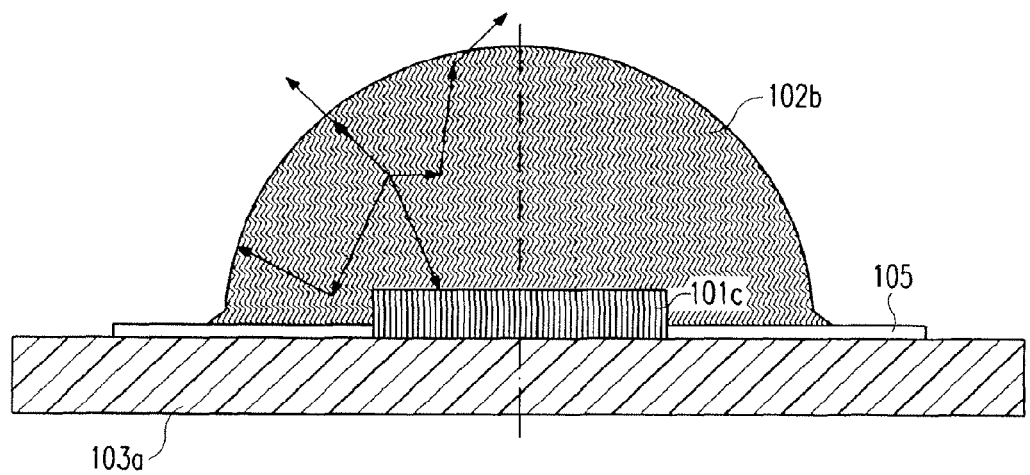
Figure 6:
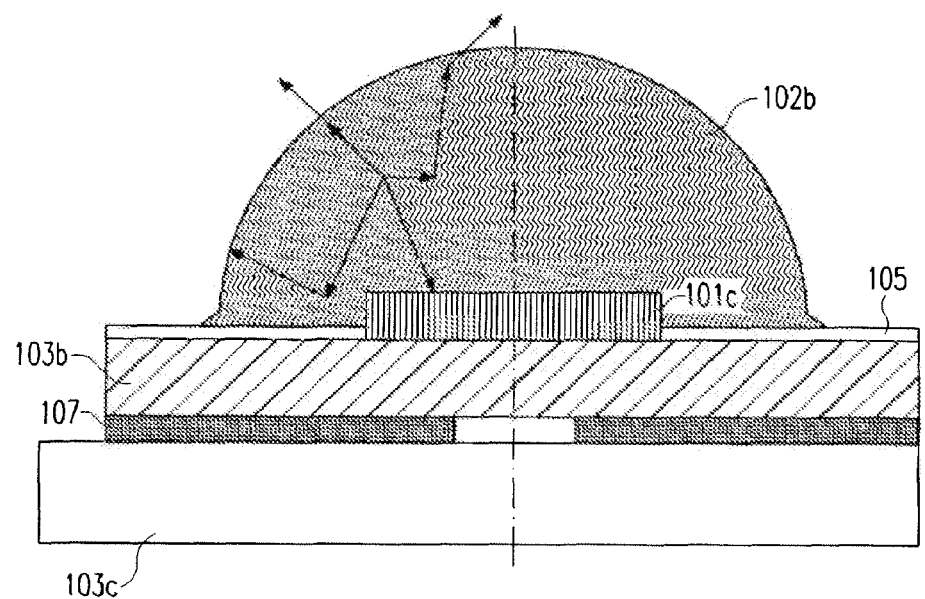
Figure 7:
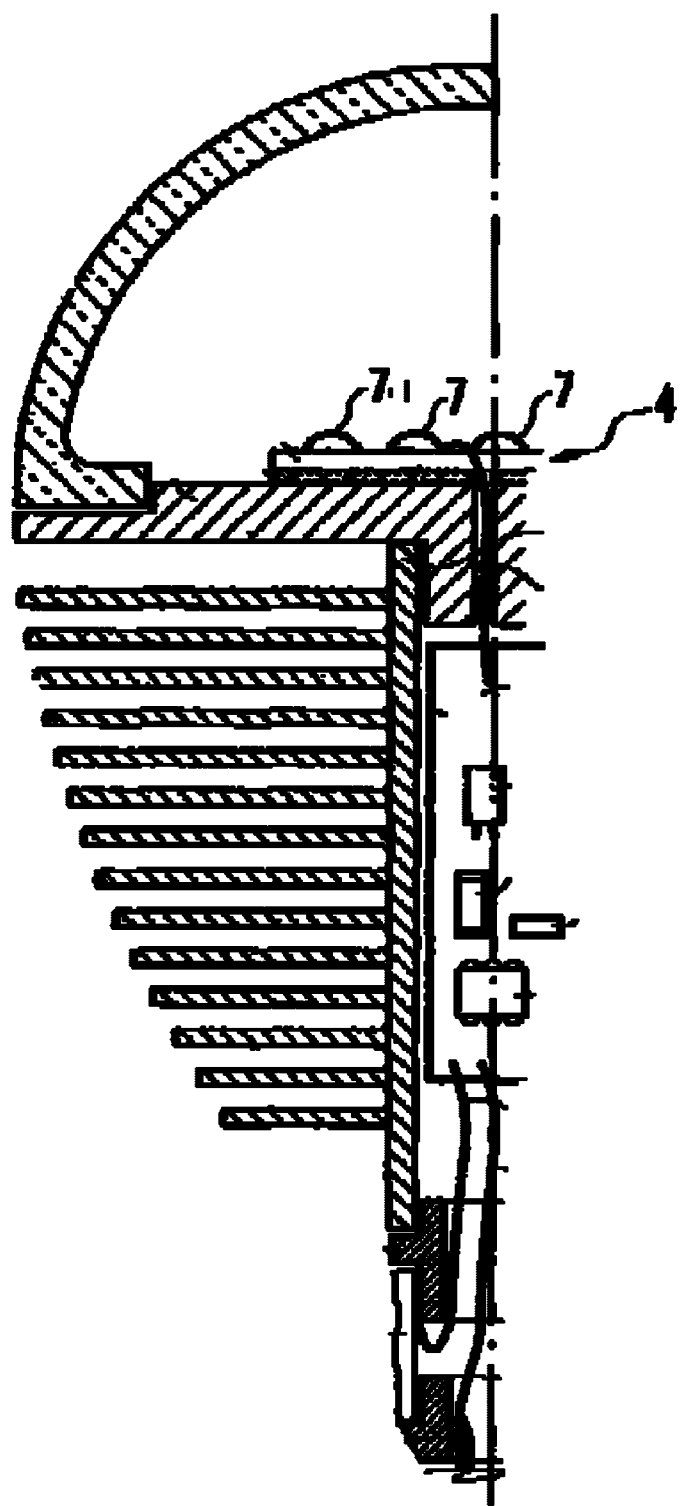
Figure 8:
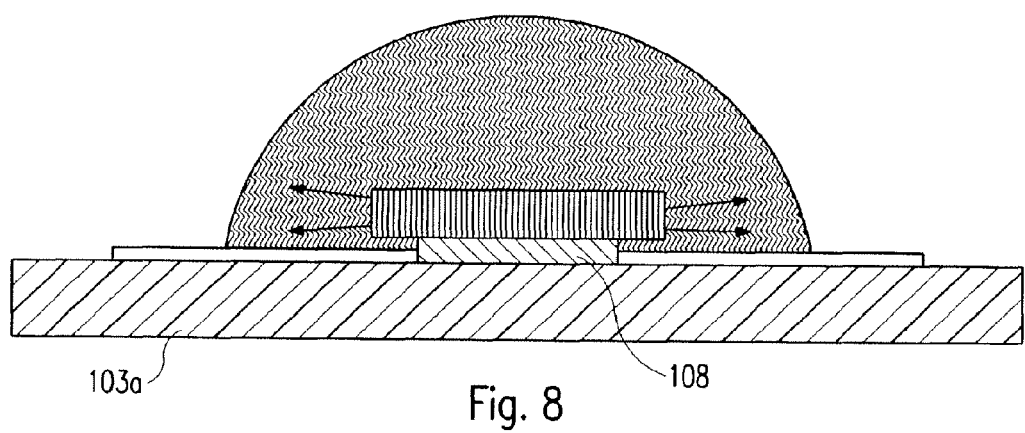

FIG. 3 shows a chip package with a white coating according to one preferred embodiment of the invention, FIG. 4 shows an LED chip package with an additional dam in order to define an external shape for the white coating, FIG. 5 shows a white coating which has been applied to the LED chip package for an LED chip with lateral emission, FIG. 6 shows a white coating, which has been applied to an SMD package, with an LED chip with side emission, FIG. 7 shows a converted LED module, which is known from DE 20 2007 008 258 A1 and with which the present invention can be used, and FIG. 8 shows a further development of the embodiment shown in FIGS. 5 and 6.

In order to overcome some of the problems shown in FIG. 2, a reflective coating can be applied to that surface of the mount or the board on which the LED chip is mounted and which surrounds the LED chip. The reflective coating may cover all parts with restricted reflection capability and in particular parts which are covered by the spherical cover.

More than one LED chip may be positioned under the same spherical cover (in which case a spherical cover is only one example of an element which contains phosphor and is arranged above the LED chips). "Spherical cover" therefore simply represents an element which is arranged on one or more LED chips.

One or more of these LEDs may emit light in the blue spectrum, which is partially converted down by the phosphor.

In addition, one or more LEDs may emit spectra which are essentially not converted down by the phosphor. This is the case, for example, for at least one LED chip which emits red light and is covered by a phosphor which is intended to convert the blue light down.

This arrangement can be used for a converted LED module, that is to say an LED module with electrical connections which are comparable to an incandescent bulb or a halogen lamp. This converted module is disclosed in DE 20 2007 008 258 U1, whose disclosure is hereby included by reference. In particular, reference is made to FIG. 1 in DE 20 2007 008 258 U1, which is attached as FIG. 7 of the present description. The board 4 and LEDs 7 shown in FIG. 4 may also be those according to the present invention.

The spherical cover may be a distributed spherical cover or a preformed, in general hemispherical, lens element.

The side walls of the LED chip may likewise be coated, since they are generally produced on the basis of silicon, a semiconductor with a known low reflection capability. This design method allows all reflection restrictions to be reduced to a minimum, leading to an optimum output.

The advantage of maintaining a lower chromaticity coordinate tolerance with respect to the package illustrated in FIG. 1 can likewise be achieved.

Normally used solder resist layers on the PCBs exhibit a typical reflection of 90%, and some down to only 60%. The reflection for some types likewise changes during the thermal processes during production. The reflection of a gold coating is even poorer, because of significant absorption of blue light. This could be prevented for example by using coatings which are produced from silver, but the migration rate of gold is much less than that of silver, which can lead to reduced reliability. In order to maximize the output, a high reflection capability should be aimed for, and this can be achieved by a reflective coating.

The coating of the reflective material (white coating) can be applied using standard distribution techniques, and it may have a thickness from 5 μm to 250 μm, preferably 20 μm to 200 μm, more preferably 100 μm to 150 μm.

The LED chip can be applied to its mount structure using an adhesion promoter or adhesive. These materials have the undesirable tendency to flow upward on the lateral walls of the LED chip. The white coating according to the present invention preferably has a thickness which is sufficiently great to ensure that the white coating is actually in contact with the LED chip above any flowing adhesion promoter or adhesive. In this respect, the thickness of the white coating is chosen such that it is higher than the expected flowing height.

Measured from the surface of the board or of the mount, the thickness is preferably about 75% to 90% of the thickness of the LED chip. The upper surface of the layer of the reflective material is therefore lower, but essentially parallel to, the upper surface (light-emitting surface) of the LED chip. The light output improvement achieved is in the region of 15% over the visible range for white LEDs of, for example, normal white light.

Typical pigments, such as those used in a resin matrix of the reflective material, are electrically non-conductive materials, for example $TiO_2$, $BaSO_3$, $ZrO_2$, $BaTiO_3$. A method is likewise disclosed for producing an LED such as this, which contains a white coating layer.

The layer of the reflective material, see FIG. 3, may have inclined side walls, that is to say side walls which are not vertical.

The spherical cover may be in the form of a hemisphere.

The color conversion material may, for example, be provided in the silicone matrix of the spherical cover and/or on the LED chip (cf. FIG. 1).

FIG. 4 shows an LED chip package having an additional dam, in order to define an external shape for the white coating. The dam is preferably formed before the white coating is applied. The dam can preferably be produced from a material, such as a material based on silicone, and therefore from a material which is not the same as the material of the white coating.

FIG. 5 shows an embodiment for a COB package using an LED chip with side emission (side emission—side walls of the light-emitting chip when a transparent substrate such as sapphire or SiC is used). In this case, the thickness of the white coating is preferably less than 50% of the height of the LED chip, more preferably less than 25%, and most preferably less than 10%.

The embodiment shown in FIG. 5 can be further developed as shown in FIG. 8 by placing the LED chip on a mount whose contours—seen from above—are the same as or smaller than the contours of the LED chip in at least one dimension. The white coating can therefore flow selectively, and may therefore be present under the bottom surface of the LED chip. This mount may have a height which is greater than the thickness of the white coating.

Alternatively, that surface of the mount which surrounds the LED chip may be notched in, for example by etching. These two features ensure that the white coating essentially does not cover those surfaces of the LED chip which emit lateral light, even though it is in contact with the side walls of the LED chip.

FIG. 6 shows an example of an SMD package having an LED chip with side emission. The thickness of the white coating is preferably less than 50% of the height of the LED chip, more preferably less than 25%, and most preferably less than 10%.

The LED chip in FIG. 6 is mounted on an LED package mount which is in turn soldered, for example, to a PCB.

LIST OF REFERENCE SYMBOLS

101 LED chip
101a LED chip—no side emission
101b LED chip without lateral emission
101c LED chip with lateral light emission
102a Silicone hemisphere, transparent
102b Silicone hemisphere, filled with phosphor
103a PCB, SMD package
103b SMD package mount
103c PCB
104 Phosphor coating
105 White, highly reflective coating
106 Barrier for coating material
107 Soldering agent
108 Mount

What is claimed is:

1. An LED module comprising:
 a printed circuit board (PCB) or a surface mount device (SMD) mount;
 an LED die mounted on the PCB or the SMD mount; and
 a semi-spherical cover attached to a white reflective material, said white reflective material covering at least a portion of a surface of the PCB or the SMD mount, and said semi-spherical cover covering the LED die;
 wherein the white reflective material is in contact with and encircles the opposing lateral side walls of the LED die, and
 wherein the white reflective material does not extend above a top surface of the LED die when viewing the LED module from the side.

2. The LED module as claimed in claim 1, wherein the white reflective material is a layer which has a thickness of between 5 μm and 250 μm.

3. The LED module as claimed in claim 1, wherein a lateral side wall of the LED die is coated with a material which is arranged such that it is reflective for the light which strikes the LED die.

4. The LED module as claimed in claim 1, wherein a color conversion material is provided in the semi-spherical cover and/or on the top surface of the LED die.

5. The LED module as claimed in claim 4, wherein the white reflective material is reflective at least for a spectrum which is emitted from the LED die and the color conversion material.

6. The LED module as claimed in claim 5, wherein the LED module emits white light, which is a mixture from the spectrum of the LED die and an emission spectrum of the color conversion material.

7. The LED module as claimed in claim 6, wherein the reflective material is an electrically non-conductive material.

8. The LED module as claimed in claim 1, wherein a multiplicity of LED dies are arranged under the cover.

9. The LED module as claimed in claim 8, wherein the LED die emits a spectrum which is partially converted down by a phosphor, and the LED module includes a further LED die that emits a spectrum which is not affected by the phosphor.

10. A modified LED lamp which has at least one LED module as claimed in claim 9.

11. An LED lamp comprising:
 an LED module which has a printed circuit board (PCB) or a surface mount device (SMD) mount and a multiplicity of LED dies which are mounted on the PCB or the SMD mount; and
 a semi-spherical cover attached to a white reflective material, said white reflective material covering at least a portion of a surface of the PCB or the SMD mount, and said semi-spherical cover covering the multiplicity of LED dies,
 wherein the white reflective material is in contact with and encircles the opposing lateral side walls of the multiplicity of LED dies,
 wherein the white reflective material does not extend above a top surface of the multiplicity of LED dies when viewing the LED module from the side, and
 wherein at least one LED die of the multiplicity of LED dies emits blue light which is partially converted by a phosphor, and wherein at least one LED die of the multiplicity of LED dies emits light in the red spectrum, which is not affected by the phosphor.

12. The LED module as claimed in claim 11, wherein the white reflective material comprises a layer which has a thickness of between 100 μm and 150 μm.

13. The LED module as claimed in claim 11, wherein a lateral side wall of the multiplicity of LED dies is coated with a material which is arranged such that it is reflective for light which strikes the multiplicity of LED dies.

14. The LED module as claimed in claim 11, wherein a color conversion material is provided in the semi-spherical cover and/or on an upper surface of the multiplicity of LED dies.

15. The LED module as claimed in claim 14, wherein the white reflective material is reflective at least for a spectrum which is emitted from the multiplicity of LED dies and the color conversion material.

16. The LED module as claimed in claim 15, wherein the LED module emits white light, which is a mixture of the spectrum of the multiplicity of LED dies and an emission spectrum of the color conversion material.

* * * * *